(12) United States Patent
Liu et al.

(10) Patent No.: US 11,594,680 B2
(45) Date of Patent: Feb. 28, 2023

(54) METHOD OF FORMING A FINFET DEVICE

(71) Applicant: Taiwan Semiconductor Manufacturing Co., Ltd., Hsinchu (TW)

(72) Inventors: Chang-Miao Liu, Hsinchu (TW); Bwo-Ning Chen, Keelung (TW); Kei-Wei Chen, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/463,790

(22) Filed: Sep. 1, 2021

(65) Prior Publication Data
US 2021/0399221 A1 Dec. 23, 2021

Related U.S. Application Data

(63) Continuation of application No. 16/837,641, filed on Apr. 1, 2020, now Pat. No. 11,139,432.

(51) Int. Cl.
*H01L 45/00* (2006.01)
(52) U.S. Cl.
CPC .......... *H01L 45/1675* (2013.01); *H01L 45/06* (2013.01); *H01L 45/1206* (2013.01)
(58) Field of Classification Search
CPC ....................................................... H01L 45/06
See application file for complete search history.

(56) References Cited

U.S. PATENT DOCUMENTS

| | | | |
|---|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |
| 9,608,116 B2 | 3/2017 | Ching et al. |
| 2019/0067457 A1 | 2/2019 | More et al. |
| 2019/0103491 A1 | 4/2019 | Chan et al. |

*Primary Examiner* — Mounir S Amer
(74) *Attorney, Agent, or Firm* — Slater Matsil, LLP

(57) ABSTRACT

A method of forming a semiconductor device includes patterning a mask layer and a semiconductor material to form a first fin and a second fin with a trench interposing the first fin and the second fin. A first liner layer is formed over the first fin, the second fin, and the trench. An insulation material is formed over the first liner layer. A first anneal is performed, followed by a first planarization of the insulation material to form a first planarized insulation material. After which, a top surface of the first planarized insulation material is over a top surface of the mask layer. A second anneal is performed, followed by a second planarization of the first planarized insulation material to form a second planarized insulation material. The insulation material is etched to form shallow trench isolation (STI) regions, and a gate structure is formed over the semiconductor material.

20 Claims, 21 Drawing Sheets

METHOD OF FORMING A FINFET DEVICE

PRIORITY CLAIM AND CROSS-REFERENCE

This application is a continuation of U.S. patent application Ser. No. 16/837,641, filed on Apr. 1, 2020, entitled "Method of Forming a FinFET Device," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional challenges arise that present opportunities for further improvements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
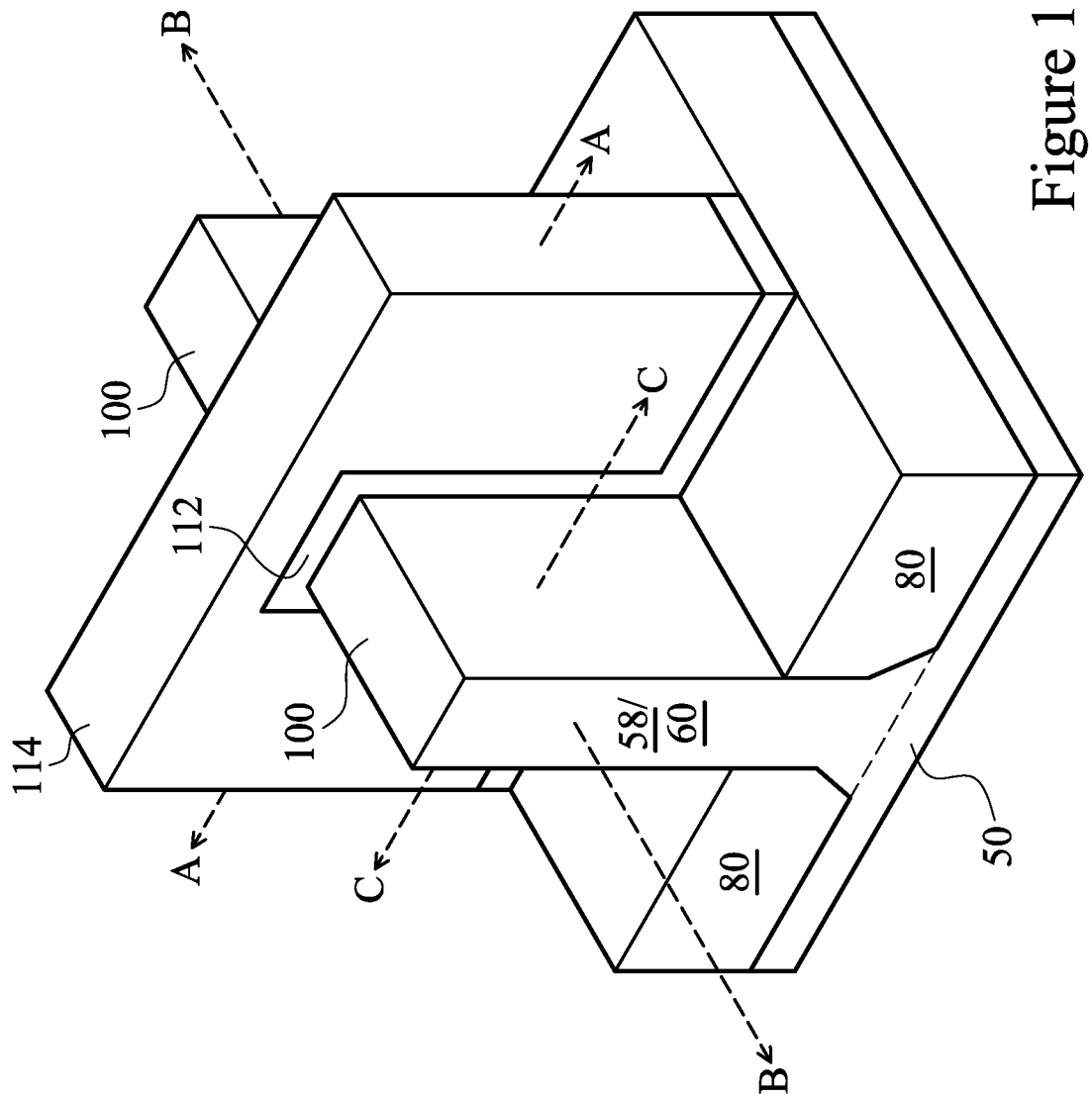
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments provided herein reduce or prevent oxidation of the upper portions of semiconductor fins during formation of the shallow trench isolation (STI) regions that surround the semiconductor fins. Formation of the STI regions includes certain anneal steps in environments that may cause fin loss, such as an anneal in an oxygen-containing environment. Generally, as electronic components decrease in size, details in the physical shape and chemical structure of the individual features become increasingly critical to performance. In the case of a fin field-effect transistor (FinFET), for example, the size and shape of the upper portion most proximal to the gate electrode affects the ability of the fin to pass current between the source and drain regions or to stop the current flow altogether. Indeed, the speed at which any transistor can turn "on" or "off" is based in part on the gate area, e.g., the area of the channel region that is immediately affected by an electrical field formed by supplying a voltage potential to the gate electrode. In the case of the fin of a FinFET, removal of parts of the upper portion may result in decreasing the gate area. Some semiconductor materials, such as silicon germanium, are used to form semiconductor fins in order to provide a strain to the channel region, which improves performance of the transistor. Embodiments such as those discussed below reduce exposure of the channel region of the fin to other elements, such as oxygen, thereby limiting oxygen incorporated into the lattice structure that may relax or decrease the strain thereby mitigating the strain.

For example, carefully choosing materials and thicknesses of those materials protecting the semiconductor fins during the anneal steps will reduce or eliminate oxidation in the semiconductor fins. As a result, upper portions of the semiconductor fins will maintain a profile as designed or will achieve a profile closer to a designed shape—e.g., a squared shape—and the gate electrode also will be subsequently formed with the shape and gate area as designed or closer to as designed. In addition, the lattice structure of the semiconductor materials of the semiconductor fins are important to the performance and, therefore, having little to no presence of oxygen in their lattice structures further ensures increased performance of the transistors.

FIG. 1 illustrates an example of a fin field-effect transistor (FinFET) in a three-dimensional view, in accordance with some embodiments. The FinFET comprises a fin 58/60 on a substrate 50 (e.g., a semiconductor substrate). Isolation regions 80 are disposed in the substrate 50, and the fin 58/60 protrudes above and from between neighboring isolation regions 80. Although the isolation regions 80 are described/illustrated as being separate from the substrate 50, as used herein the term "substrate" may be used to refer to just the semiconductor substrate or a semiconductor substrate inclusive of isolation regions. As illustrated, the fin 58/60 and the substrate 50 may comprise the same materials, distinct materials, and/or a plurality of materials. In this context, the fin 58/60 refers to the portion extending between and protruding above the neighboring isolation regions 80.

A gate dielectric layer 112 is along sidewalls and over a top surface of the fin 58/60, and a gate electrode 114 is over the gate dielectric layer 112. Source/drain regions 100 are disposed in opposite sides of the fin 58/60 with respect to the gate dielectric layer 112 and gate electrode 114. FIG. 1 further illustrates reference cross-sections that are used in later figures. Cross-section A-A is along a longitudinal axis of the gate electrode 114 and in a direction, for example, perpendicular to the direction of current flow between the source/drain regions 100 of the FinFET. Cross-section B-B is perpendicular to cross-section A-A and is along a longitudinal axis of the fin 58/60 and in a direction of, for example, a current flow between the source/drain regions 100 of the FinFET. Cross-section C-C is parallel to cross-section A-A and extends through a source/drain region 100 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 19B are cross-sectional views of intermediate stages in the manufacturing of FinFETs, in accordance with some embodiments. FIGS. 2 through 10 illustrate reference cross-section A-A illustrated in FIG. 1, except for multiple fins/FinFETs. FIGS. 11A, 12A, 13A, 14A, 15A, 16A, 17A, 18A, and 19A are also illustrated along reference cross-section A-A illustrated in FIG. 1, and FIGS. 11B, 12B, 13B, 14B, 15B, 16B, 17B, 17C, 18B, and 19B are illustrated along a reference cross-section B-B illustrated in FIG. 1, except for multiple fins/FinFETs. FIGS. 13C and 13D are illustrated along reference cross-section C-C illustrated in FIG. 1, except for multiple fins/FinFETs.

Figure 2:
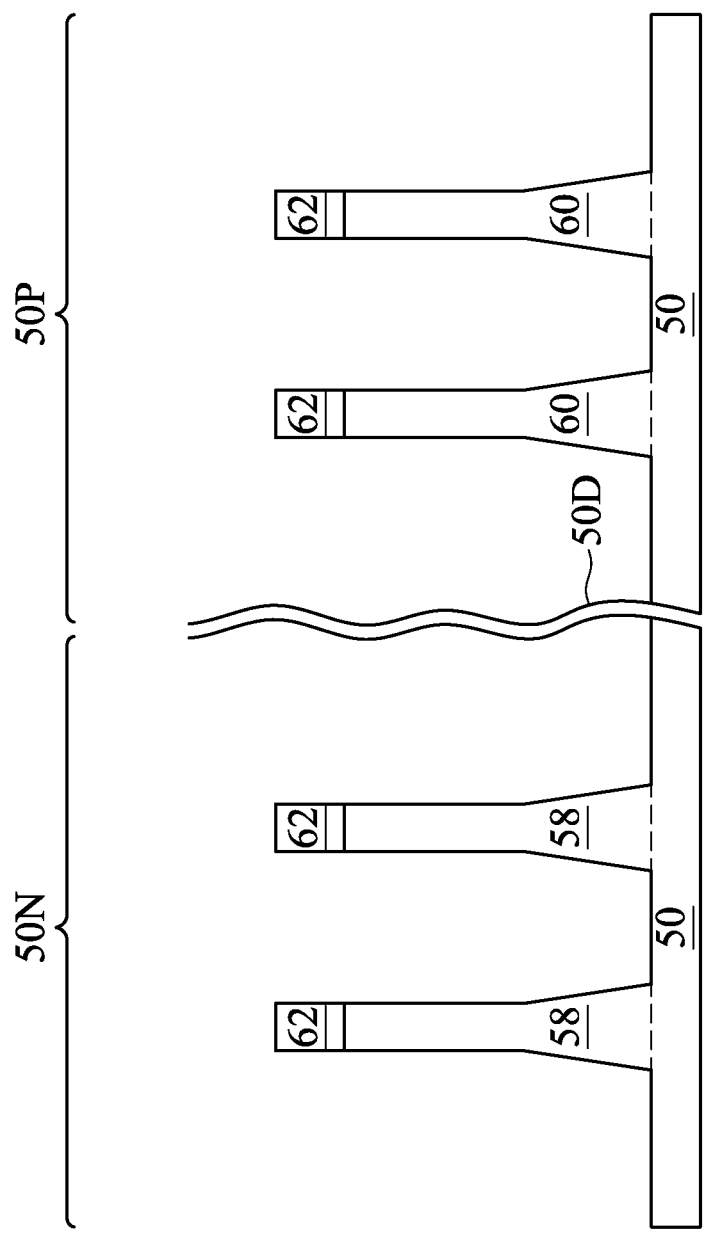
FIGS. 2, 3, 4, 5, 6, 7, 8, 9, 10, 11A, 11B, 12A, 12B, 13A, 13B, 13C, 13D, 14A, 14B, 15A, 15B, 16A, 16B, 17A, 17B, 17C, 18A, 18B, 19A, and 19B are cross-sectional views of intermediate stages in the manufacturing of FinFETs, in accordance with some embodiments.

In FIG. 2, a substrate 50 having first fins 58 in region 50N and second fins 60 in region 50P is illustrated. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 50D), and any number of device features (e.g., other active devices, doped regions, isolation structures, etc.) may be disposed between the region 50N and the region 50P.

The first fins 58 and the second fins 60 (collectively referred to as fins 58/60) may be formed of the same semiconductor material or different semiconductor materials as the substrate 50. The semiconductor strips of the fins 58/60 may be formed by any suitable process. For example, in some embodiments in which the first fins 58 are formed of silicon and the second fins 60 are formed of silicon germanium, a recess may be formed in the substrate in the region 50P, after which a layer of silicon germanium may be epitaxially grown in the recess. A planarization process, such as a chemical mechanical polishing (CMP) process, may be performed to level the upper surfaces of the silicon material in the region 50N and the silicon germanium material in the region 50P. Thereafter, the fins 58/60 may be patterned by any suitable method. For example, the fins 58/60 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (such as masks 62 as illustrated in FIG. 2) may remain on the fins 58/60. The fins 58/60 and masks 62 together comprise fin stacks. Each of the masks 62 may have a thickness of between about 200 Å and about 800 Å.

Other methods may be used to form the fins 58/60. For example, the fins 58/60 may be formed by depositing a sacrificial masking layer over the substrate 50 and patterning openings in the sacrificial masking layer, wherein the openings correspond to locations of the fins 58/60. An epitaxial material, such as silicon in region 50N and silicon germanium in region 50P, may be grown in the openings. Region 50N may be masked while epitaxially growing the second fins 60 in region 50P, and region 50P may be masked while epitaxially growing the first fins 58 in region 50N. Other processes may also be used.

FIGS. 3-9 illustrate a process to form shallow trench isolation (STI) regions 80 (see FIG. 9) in accordance with some embodiments. Generally, the process discussed below forms STI regions that will electrically isolate various semiconductor devices (e.g., transistors) from one another. The following STI formation process includes ways to protect various features of a transistor (e.g., the fins 58/60 of FinFET devices) from oxidation during thermal treatments (e.g., anneals) in oxygen environments.

Figure 3:
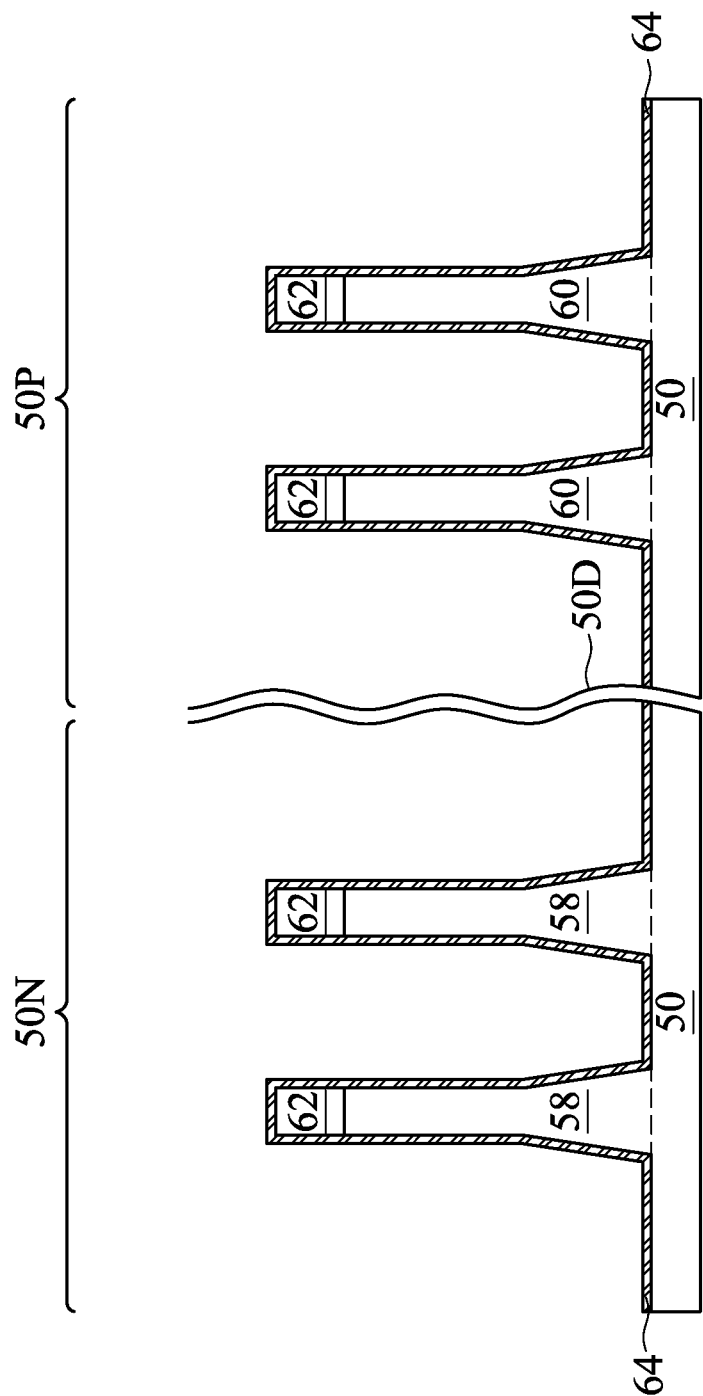

Referring first to FIG. 3, a semiconductor liner layer 64 is formed over and between neighboring fins 58/60. As discussed below, the semiconductor liner layer 64 provides protection to the fins 58/60 during the STI formation process. The semiconductor liner layer 64 may comprise silicon (Si), silicon carbon (SiC), silicon germanium (SiGe), or the like. The semiconductor liner layer 64 may be epitaxially grown using a process such as chemical vapor deposition (CVD), atomic layer deposition (ALD), vapor phase epitaxy (VPE), molecular beam epitaxy (MBE), or the like. The semiconductor liner layer 64 may be deposited at a thickness of about 10 Å to about 30 Å, or about 10 Å to about 20 Å. As will be discussed in subsequent steps, a benefit of having a thicker semiconductor liner layer 64 is protection of the fins 58/60 from oxidation during steps, such as anneal processes.

Figure 4:
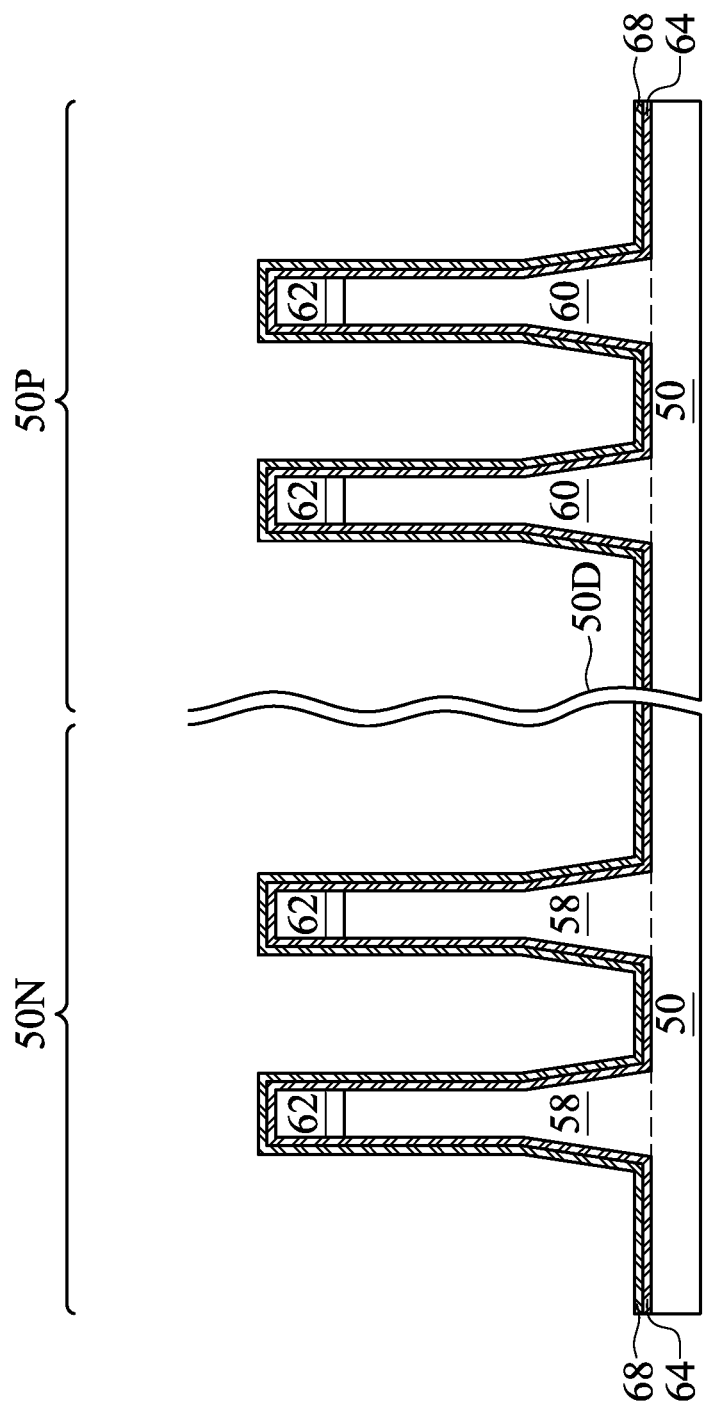

In FIG. 4, optionally, an insulation liner layer 68 may be formed over the semiconductor liner layer 64. The insulation liner layer 68 provides a stable dielectric liner that will form a boundary for the STI regions. The insulation liner layer 68 is similarly formed over and between neighboring fins 58/60. The insulation liner layer 68 may comprise an oxide, such as silicon oxide, a nitride, such as silicon nitride, the like, or a combination thereof, such as silicon oxynitride or a composite layer of an oxide and silicon nitride. The insulation liner layer 68 may be formed by CVD, such as a high density plasma chemical vapor deposition (HDP-CVD) (e.g., a CVD-based material deposition in a remote plasma system and post-curing to make it convert to another material, such as an oxide), ALD, VPE, MBE, the like, or a combination thereof. In some embodiments, the insulation liner layer 68 is thermally grown from the semiconductor liner layer 64. The insulation liner layer 68 may have a thickness in a range from greater than 0 Å to less than or equal to about 20 Å, such as about 10 Å to about 20 Å. A combined thickness of the semiconductor liner layer 64 and the insulation liner layer 68 may be between 10 Å to about 50 Å, such as about 20 Å to about 40 Å.

Although illustrated as formed in both the region 50N and the region 50P, the insulation liner layer 68 may be formed in the region 50P, such as over and between the fins 60, which may be formed of silicon germanium. In some embodiments, the insulation liner layer 68 is deposited over both the region 50N and the region 50P, and then patterned (e.g., by etching) to be removed from the region 50N. Alternatively, the region 50N may be masked while the insulation liner layer 68 is deposited over the region 50P.

Figure 5:
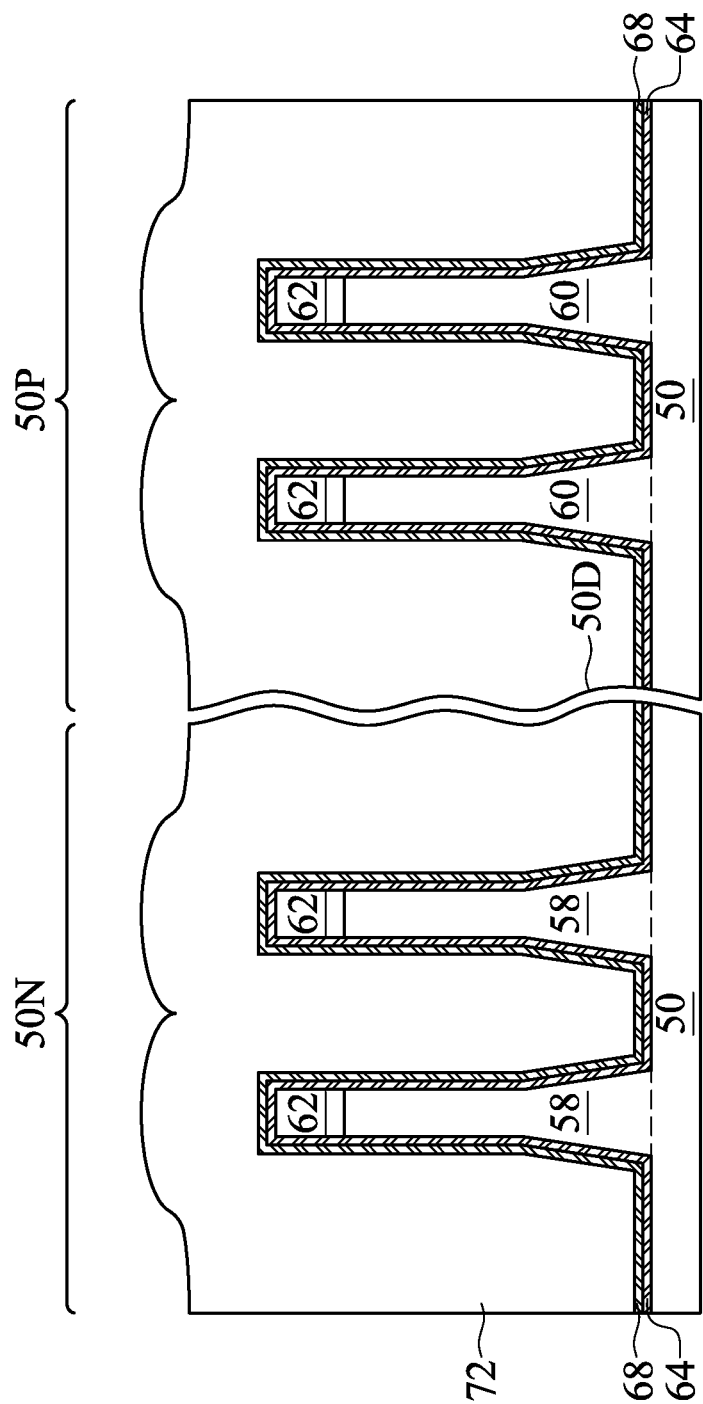

In FIG. 5, a first insulation material 72 is formed over the semiconductor liner layer 64 and over the insulation liner layer 68 if formed, including over and between neighboring fins 58/60. The first insulation material 72 may be an oxide, such as silicon oxide, a nitride, the like, or a combination thereof, and may be formed by an HDP-CVD, an FCVD, the like, or a combination thereof. Other insulation materials formed by any acceptable process may be used. In the illustrated embodiment, the first insulation material 72 is silicon oxide formed by a FCVD process. The insulation liner layer 68 and the first insulation material 72 may comprise the same (e.g., silicon oxide) or different materials (e.g., silicon nitride and silicon oxide, respectively) for portions formed over the region 50N and portions formed over the region 50P. In some embodiments, they comprise similar materials with different levels and/or types of doping. As a result of the deposition method and the shapes of the fins 58/60, the first insulation material 72 may have an uneven top surface. Following formation of the first insulation material 72, a first cleaning process may be performed to remove impurities from an upper portion of the first insulation material 72. The first cleaning process may include ammonium peroxide ($NH_4OH$), hydrogen peroxide ($H_2O_2$), water, the like, or any combination thereof.

Figure 6:
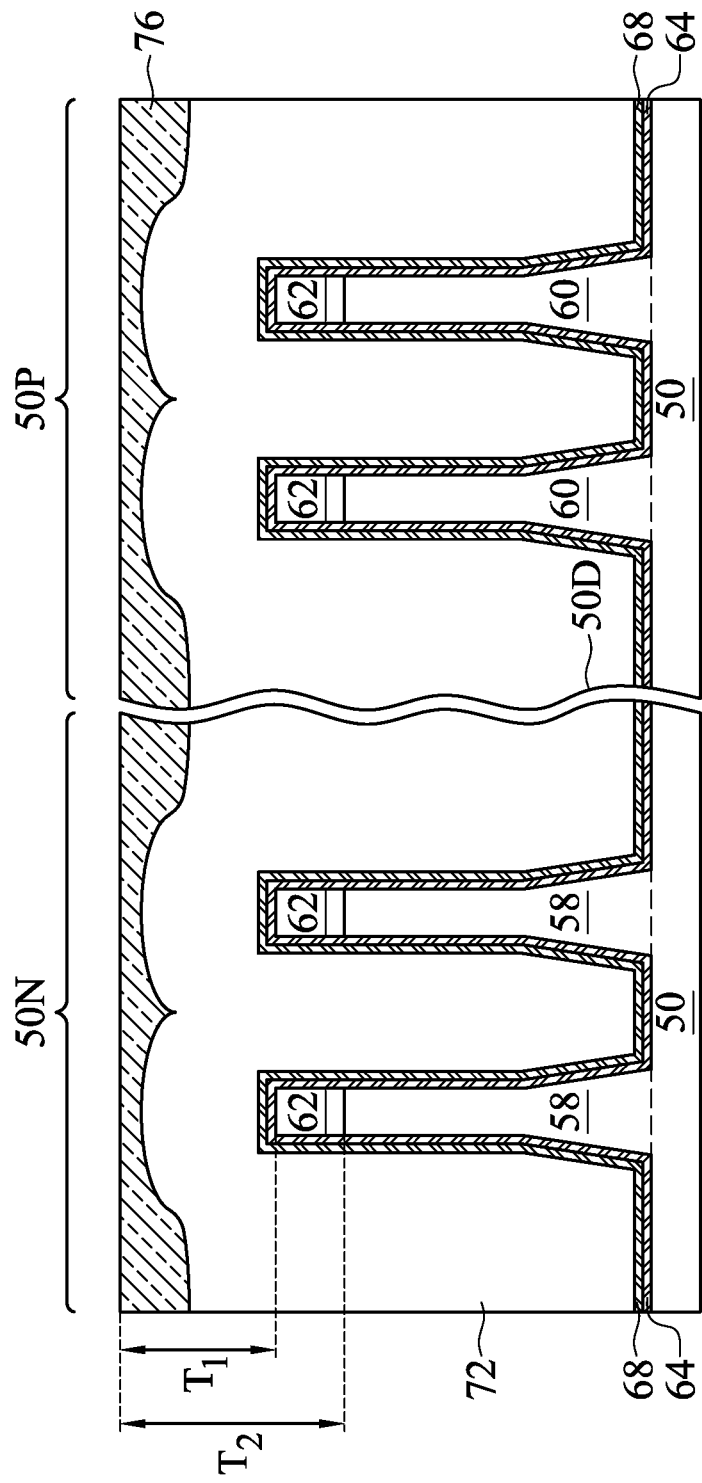

In FIG. 6, a first anneal process may be performed to densify the insulation material 72 and the insulation liner layer 68. Although not specifically illustrated, the first anneal process may oxidize all or part of the semiconductor liner layer 64, which may result in the semiconductor liner layer 64 combining with the insulation liner layer 68. In some embodiments that are also not specifically illustrated, the first anneal process may also blur the boundary between the insulation material 72 and the insulation liner layer 68. The first anneal process may be performed for between about 20 minutes and about 8 hours, or between about 1 and 2 hours, and at temperatures between about 300° C. and about 800° C., such as less than 700° C., or even less than 500° C. In some embodiments, the first anneal process comprises a wet anneal portion and a dry anneal portion. The wet anneal portion includes oxygen or water, while the dry anneal portion is performed in a nitrogen ambient.

A benefit of the semiconductor liner layer 64 is to act as a buffer and, therefore, reduce or prevent oxidation of the fins 58/60. This benefit is achieved as the semiconductor liner layer 64 serves as a last line of defense by oxidizing to some degree by ambient oxygen during the first anneal process. For example, oxidation of the second fins 60 (e.g., when comprised of silicon germanium) during the anneal process would be more likely to occur without the presence of the semiconductor liner layer 64.

Still referring to FIG. 6, following the first anneal process, a second insulation material 76 is formed over the first insulation material 72 in order to provide a smoother and more even top surface. The second insulation material 76 may be an oxide, such as silicon oxide, a nitride, the like, or a combination thereof, and may be formed by CVD, such as plasma-enhanced CVD (PECVD), or the like. In the illustrated embodiment, the second insulation material 76 comprises a similar material as the first insulation material 72 (e.g., silicon oxide). The smoother and more even top surface of the second insulation material 76 allows for a more effective and better controlled removal process (e.g., planarization) described below in subsequent steps. After formation of the second insulation material 76, a combination of the first insulation material 72 and the second insulation material 76 (as well as the semiconductor liner layer 64 and the insulation liner layer 68) directly over top surfaces of the masks 62 may have a thickness $T_1$ of between about 1000 Å and about 5000 Å, such as about 2500 Å. Measured in a different way, all of the above-referenced layers (including the masks 62) directly over top surfaces of the fins 58/60 may have a thickness $T_2$ of between about 1200 Å and about 5800 Å, such as about 2800 Å.

Figure 7:
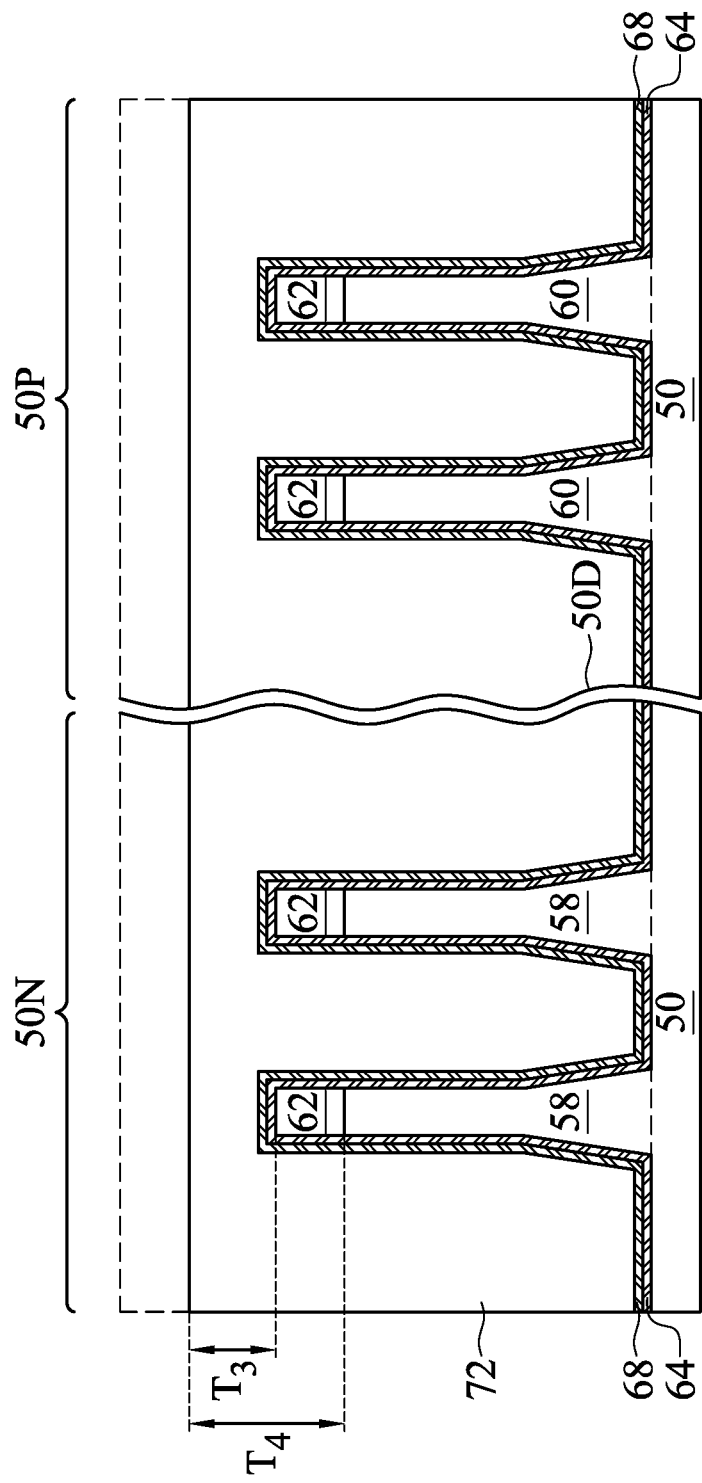

In FIG. 7, a first removal process is performed on the first insulation material 72 and the second insulation material 76 to remove portions of those layers above the fins 58/60 and the masks 62. In some embodiments, a planarization process, such as a chemical mechanical polish (CMP), an etch-back process, combinations thereof, or the like may be utilized. Following the first removal process, in some embodiments, a thickness $T_3$ of the first insulation material 72 and the second insulation material 76 (as well as the semiconductor liner layer 64 and the insulation liner layer 68) directly over top surfaces of the masks 62 may be between about 100 Å and about 500 Å, such as between about 150 Å and about 200 Å. In some embodiments, after the first removal process a thickness $T_4$ of the above-referenced layers (including the masks 62) directly over top surfaces of the fins 58/60 may be between about 200 Å and about 1300 Å, such as between about 350 Å and about 550 Å. Note that a thickness $T_3$ of less than 100 Å (or a thickness $T_4$ of less than 200 Å) may be insufficient to protect the fins 58/60, such as fins 60 that may comprise silicon germanium, from being oxidized during a subsequent annealing step discussed below. In addition, a thickness $T_3$ of greater than 500 Å (or a thickness $T_4$ of greater than 1300 Å) may unnecessarily increase processing time during formation of the first insulation material 72 and the second insulation material 76 and a subsequent planarization step, with negligible added benefit of protection from oxidation. In some embodiments, the amount of insulation material 72 above the fins 58/60 and the masks 62 is monitored in real-time during the first removal process, and the first removal process is halted when a desired thickness is obtained. Other methods, such as a timed process, may also be used. Following the first removal process, a second cleaning process may be performed to remove impurities from an upper portion of remaining portions of the first insulation material 72. The second cleaning process may include ammonium peroxide (NH$_4$OH), hydrogen peroxide (H$_2$O$_2$), water, the like, or any combination thereof.

Still referring to FIG. 7, following the removal process, a second anneal process may be performed to further densify the first insulation material 72 and the second insulation material if any remains. As discussed above with respect to the first anneal process and also not specifically illustrated, the first insulation material 72 may combine or further combine with the semiconductor liner layer 64 and/or the insulation liner layer 68. A benefit of the thickness T$_3$ or thickness T$_4$ of insulating material (e.g., the first insulation material 72, the second insulation material 76, the insulation liner layer 68, and the semiconductor liner layer 64) over the masks 62 and the fins 58/60 is protection of the fins 58/60 from oxidation during the second anneal process. To the extent the semiconductor liner layer 64 substantially oxidized during the first anneal process, the semiconductor liner layer 64 (to the extent it is distinguishable from the overlying insulating layers) may be less useful as a chemical buffer and, instead, serve as more of a physical barrier to reduce or prevent oxidation of the fins 58/60. The second anneal process may be performed for between about 30 minutes and about 3 hours, or between about 1 and 2 hours, and at temperatures between about 300° C. and about 800° C., between about 300° C. and 700° C., or between about 300° C. and about 500° C. In some embodiments, the second anneal process comprises a wet anneal portion and a dry anneal portion. The wet anneal portion includes oxygen or water, while the dry anneal portion is performed in a nitrogen ambient.

As a result of the protection afforded by the thickness T$_3$ or the thickness T$_4$, the profile of the fins 58/60 remains substantially the same before and after the second anneal. Without these protections, upper portions of the fins 58/60 may be at greater risk of oxidation, which may result in a sloping profile. Due to the protection, the upper portions of the fins 58/60 retain a squared shape with substantially vertical sidewalls. In addition, to the extent that any oxidation of the second fins 60 occurs, wherein the molecular formula of the material of the second fins 60 before the first anneal process is Si$_{1-x}$Ge$_x$, wherein the value of x is between about 0.20 and about 0.50, such as about 0.25. After the first anneal process and the second anneal process, the molecular formula of the material of outer portions of the second fins 60 is Si$_{1-x-y}$Ge$_x$O$_y$, retaining a value of x that is substantially the same. Indeed, the value of x may be between about 0.15 and about 0.50, or between about 0.20 and about 0.25, such as about 0.20, and the value of y may be less than about 0.05 (i.e., 5%), such as about 0, which indicates that the second fins 60 either were not oxidized or oxidized very little during the first and second anneal processes. As such, the value of x may be between about 15% and about 100% of its original value.

Figure 8:
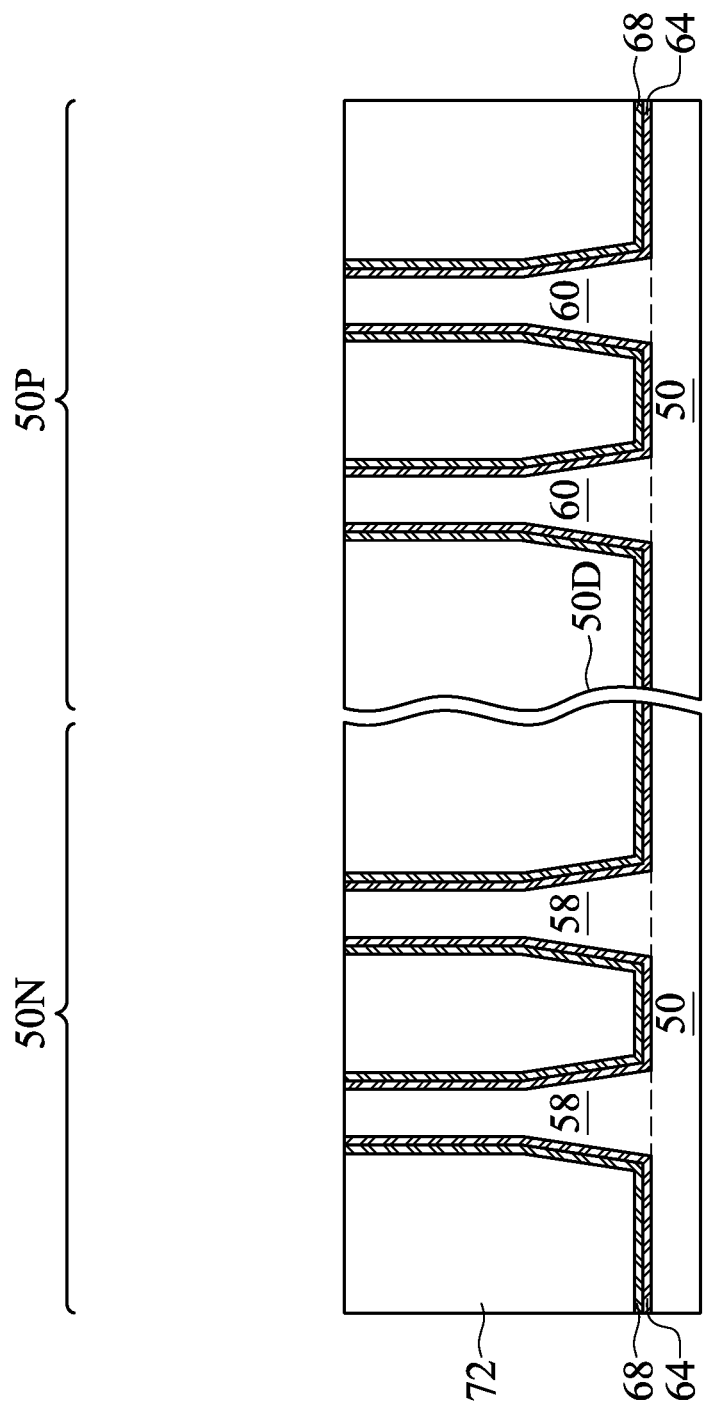

In FIG. 8, a second removal process is applied to the first insulation material 72 and any remaining of the second insulation material 76 (as well as portions of the insulation liner layer 68 and the semiconductor liner layer 64) to remove excess portions of the insulating material over the fins 58/60. In some embodiments, a planarization process such as a CMP, an etch-back process, combinations thereof, or the like may be utilized. The planarization process removes the masks 62 and exposes the fins 58/60 such that top surfaces of the fins 58/60 and the first insulation material 72 are level after the planarization process is complete. In other embodiments, the planarization process stops at the masks 62 over the fins 58/60 and exposes the masks 62.

Figure 9:
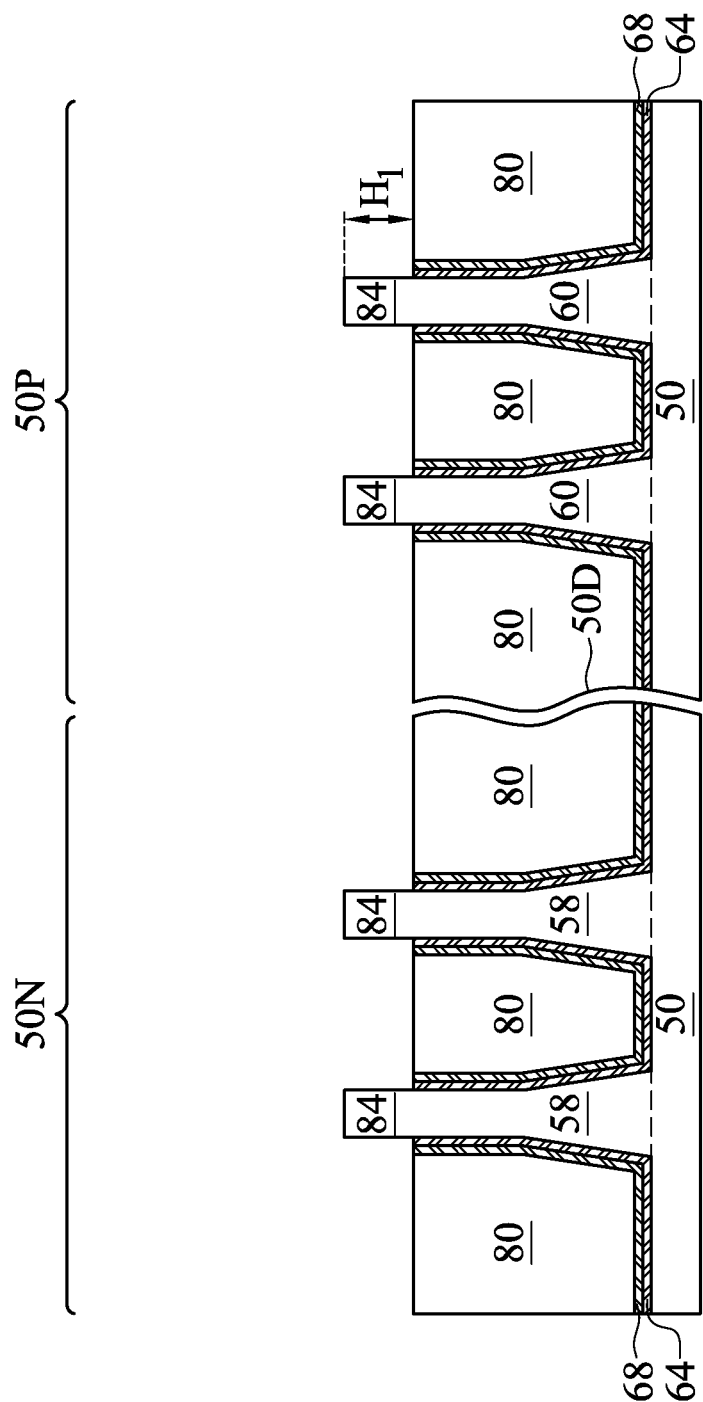

In FIG. 9, the first insulation material 72 is recessed to form Shallow Trench Isolation (STI) regions 80. The first insulation material 72 is recessed such that upper portions 84 of the fins 58/60 protrude from between neighboring STI regions 80 by a height H$_1$. Further, top surfaces of the STI regions 80 may comprise flat surfaces as illustrated, convex surfaces, concave surfaces, or combinations thereof. The top surfaces of the STI regions 80 may be formed flat, convex, and/or concave by an appropriate etch. The STI regions 80 may be recessed using an acceptable etching process, such as one that is selective to the material of the insulating material (e.g., the semiconductor liner layer 64, the insulation liner layer 68, the first insulation material 72)—for example, etching the material of the first insulation material 72 at a faster rate than the material of the fins 58/60. For example, an oxide removal using, for example, dilute hydrofluoric acid (dHF), a buffered oxide etch (BOE) solution, or a dry etch may be used. In some embodiments, the etching to form the STI regions 80 in the region 50N is performed while the region 50P is masked, and the etching to form the STI regions 80 in the region 50P is performed while the region 50N is masked. In embodiments in which the second removal process stops at the masks 62, the masks 62 may be removed during this recessing to form the STI regions 80, or removed before or after this recessing to form the STI regions 80.

Further in FIG. 9, appropriate wells (not shown) may be formed in the fins 58/60 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 58 and the STI regions 80 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the region 50P, a photoresist (not specifically illustrated) is formed over the fins 60 and the STI regions 80 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 10:
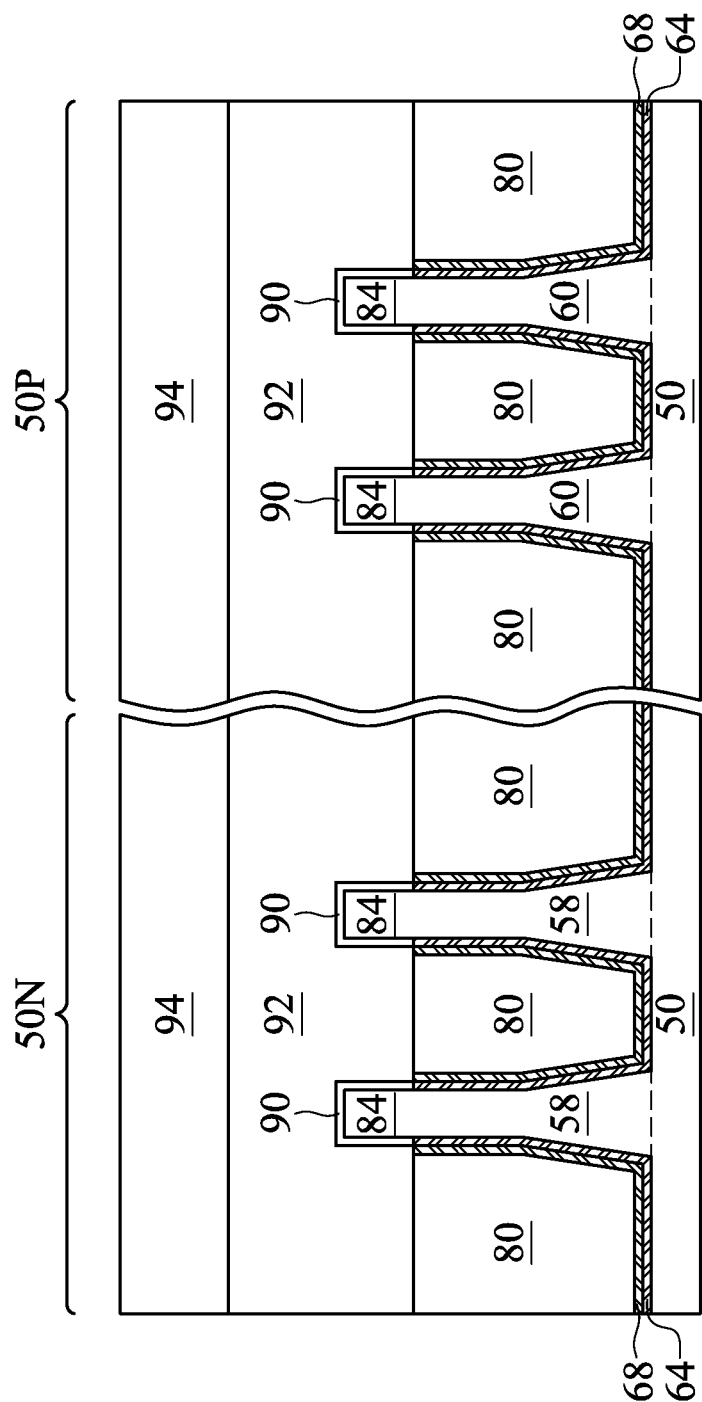

In FIG. 10, a dummy dielectric layer 90 is formed on the fins 58/60. The dummy dielectric layer 90 may be, for example, silicon oxide, silicon nitride, a combination thereof, or the like, and may be deposited or thermally grown according to acceptable techniques. The dummy dielectric layer 90 may be the same or a different material for the region 50N and the region 50P. In some embodiments with different materials or other differences in the compositions of the dummy dielectric layer 90, masking methods described above may be utilized here as well.

Still referring to FIG. 10, a dummy gate layer 92 is formed over the dummy dielectric layer 90, and a mask layer 94 is formed over the dummy gate layer 92. The dummy gate layer 92 may be deposited over the dummy dielectric layer 90 and then planarized, such as by a CMP. The mask layer 94 may be deposited over the dummy gate layer 92. The dummy gate layer 92 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 92 may be deposited by physical vapor deposition (PVD), CVD, sputter deposition, or other techniques known and used in the art for depositing the selected material. The dummy gate layer 92 may be made of other materials that have a high etching selectivity from the etching of isolation regions. The mask layer 94 may include, for example, silicon nitride, silicon oxynitride, or the like. In this example, a single dummy gate layer 92 and a single mask layer 94 are formed across the region 50N and the region 50P. It is noted that the dummy dielectric layer 90 is shown covering only the fins 58/60 for illustrative purposes only. In some embodiments, the dummy dielectric layer 90 may be deposited such that the dummy dielectric layer 90 covers the STI regions 80, extending between the dummy gate layer 92 and the STI regions 80.

FIGS. 11A through 19B illustrate various additional steps in the manufacturing of embodiment devices. FIGS. 11A through 19B illustrate features in either of the region 50N and the region 50P. For example, the structures illustrated in FIGS. 11A through 19B may be applicable to both the region 50N and the region 50P. Differences (if any) in the structures of the region 50N and the region 50P are described in the text accompanying each figure.

Figure 11B:
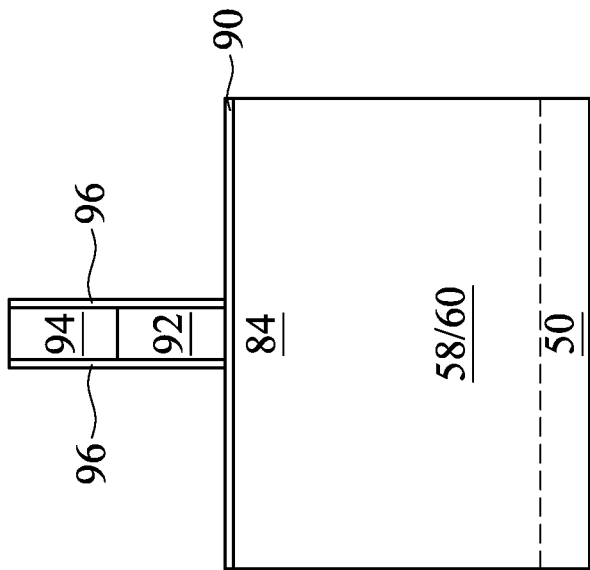
Figure 11A:
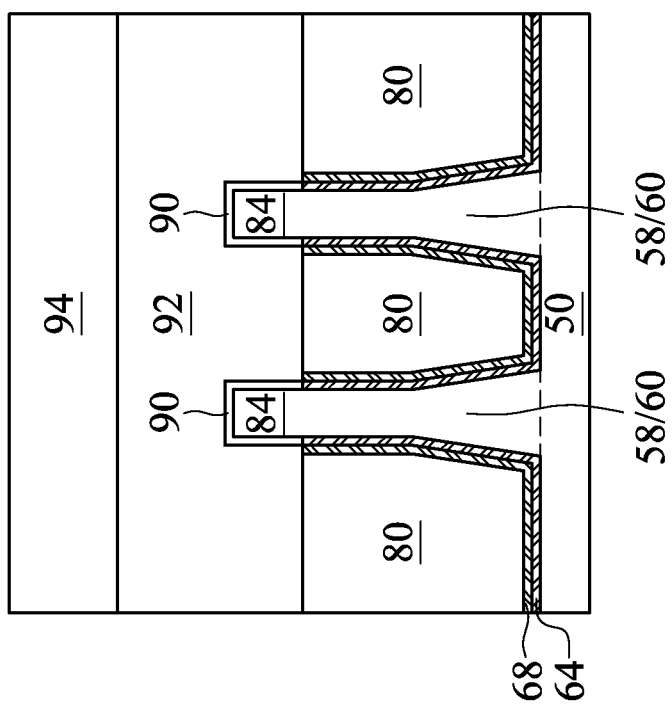

In FIGS. 11A and 11B, the mask layer 94 (see FIG. 10) may be patterned using acceptable photolithography and etching techniques to form masks 94. The pattern of the masks 94 may then be transferred to the dummy gate layer 92. In some embodiments (not illustrated), the pattern of the masks 94 may also be transferred to the dummy dielectric layer 90 by an acceptable etching technique to form dummy gates 92. The dummy gates 92 cover respective channel regions 84 of the fins 58/60. The pattern of the masks 94 may be used to physically separate each of the dummy gates 92 from adjacent dummy gates. The dummy gates 92 may also have a lengthwise direction substantially perpendicular to the lengthwise direction of respective epitaxial fins 58/60.

Still referring to FIGS. 11A and 11B, gate seal spacers 96 can be formed on exposed surfaces of the dummy gates 92, the masks 94, and/or the fins 58/60. A thermal oxidation or a deposition followed by an anisotropic etch may form the gate seal spacers 96. The gate seal spacers 96 may be formed of silicon oxide, silicon nitride, silicon oxynitride, or the like.

After the formation of the gate seal spacers 96, implants for lightly doped source/drain (LDD) regions (not explicitly illustrated) may be performed. In the embodiments with different device types, similar to the implants discussed above in FIG. 9, a mask, such as a photoresist, may be formed over the region 50N, while exposing the region 50P, and appropriate type (e.g., p-type) impurities may be implanted into the exposed fins 60 in the region 50P. The mask may then be removed. Subsequently, a mask, such as a photoresist, may be formed over the region 50P while exposing the region 50N, and appropriate type impurities (e.g., n-type) may be implanted into the exposed fins 58 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 12B:
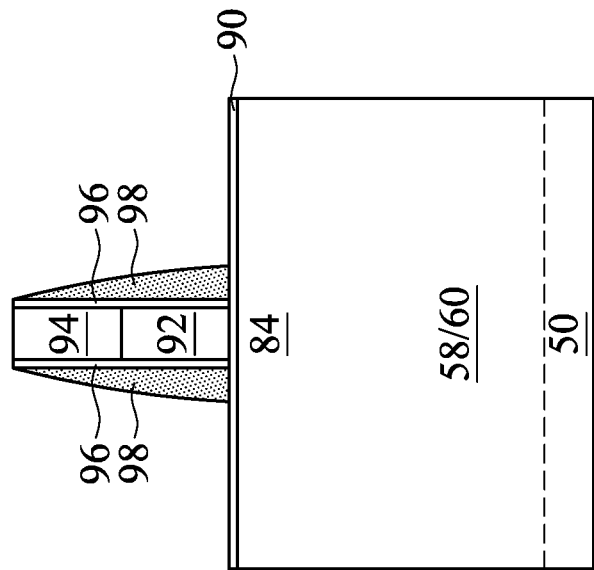
Figure 12A:
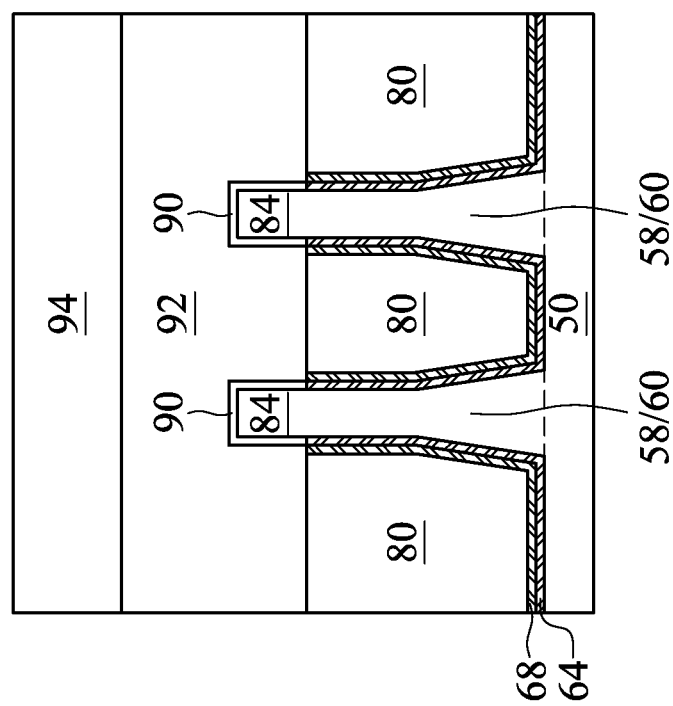

In FIGS. 12A and 12B, gate spacers 98 are formed on the gate seal spacers 96 along sidewalls of the dummy gates 92 and the masks 94. The gate spacers 98 may be formed by conformally depositing an insulating material and subsequently anisotropically etching the insulating material. The insulating material of the gate spacers 98 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 96 may not be etched prior to forming the gate spacers 98, yielding "L-shaped" gate seal spacers), spacers may be formed and removed, and/or the like. Furthermore, the n-type and p-type devices may be formed using a different structures and steps. For example, LDD regions for n-type devices may be formed prior to forming the gate seal spacers 96 while the LDD regions for p-type devices may be formed after forming the gate seal spacers 96.

Figure 13B:
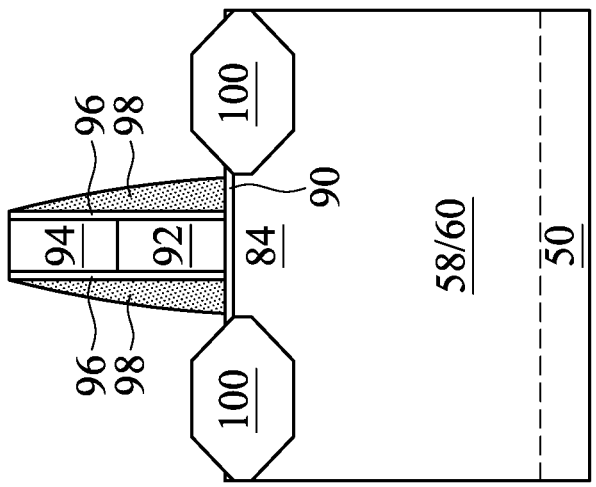
Figure 13A:
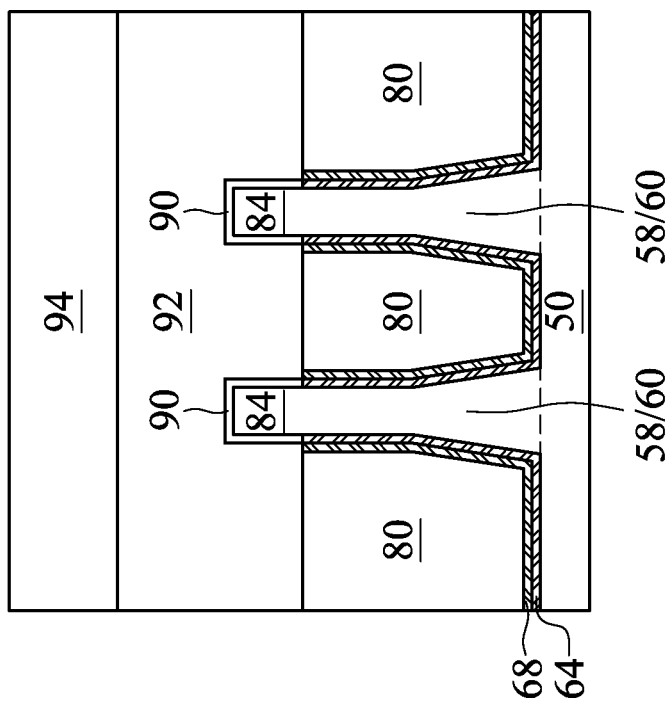
Figure 13C:
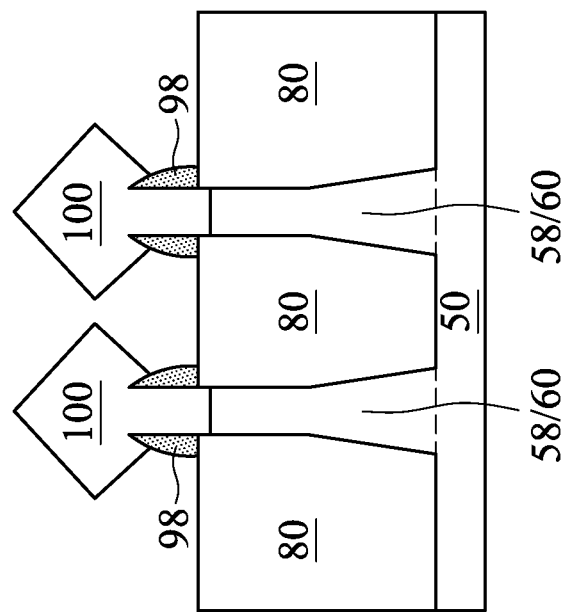
Figure 13D:
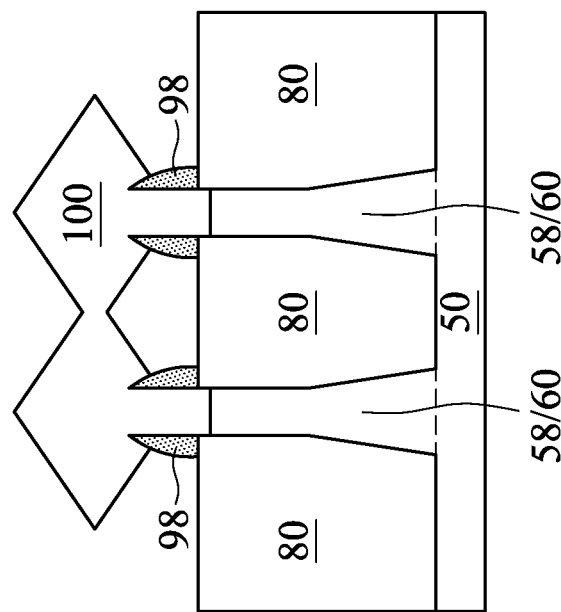

In FIGS. 13A and 13B, epitaxial source/drain regions 100 are formed in the fins 58/60 to exert stress in the respective channel regions 84 (i.e., the upper portions 84 of the fins 58/60), thereby improving performance. The epitaxial source/drain regions 100 are formed in the fins 58/60 such that each dummy gate 92 is disposed between respective neighboring pairs of the epitaxial source/drain regions 100. In some embodiments the epitaxial source/drain regions 100 may extend into, and may also penetrate through, the fins 58/60. In some embodiments, the gate spacers 98 are used to separate the epitaxial source/drain regions 100 from the dummy gates 92 by an appropriate lateral distance so that the epitaxial source/drain regions 100 do not short out subsequently formed gates of the resulting FinFETs.

The epitaxial source/drain regions 100 in the region 50N (e.g., the NMOS region) may be formed by masking the region 50P (e.g., the PMOS region) and etching source/drain regions of the fins 58 in the region 50N to form recesses in the fins 58. Then, the epitaxial source/drain regions 100 in the region 50N are epitaxially grown in the recesses. The epitaxial source/drain regions 100 may include any acceptable material, such as appropriate for n-type FinFETs. For example, the epitaxial source/drain regions 100 in the region 50N may include materials exerting a tensile strain in the channel region 84, such as silicon, silicon carbide, phosphorous doped silicon carbide, silicon phosphide, the like, or any suitable material. The epitaxial source/drain regions 100 in the region 50N may have surfaces raised from respective surfaces of the fins 58 and may have facets.

The epitaxial source/drain regions 100 in the region 50P (e.g., the PMOS region) may be formed by masking the region 50N (e.g., the NMOS region) and etching source/drain regions of the fins 60 in the region 50P are etched to form recesses in the fins 60. Then, the epitaxial source/drain regions 100 in the region 50P are epitaxially grown in the recesses. The epitaxial source/drain regions 100 may include any acceptable material, such as appropriate for p-type FinFETs. For example, the epitaxial source/drain regions 100 in the region 50P may comprise materials exerting a compressive strain in the channel region 84, such as silicon-germanium, boron doped silicon-germanium, germanium, germanium tin, the like, or any suitable material. The epitaxial source/drain regions 100 in the region 50P may also have surfaces raised from respective surfaces of the p-type fins 60 and may have facets.

The epitaxial source/drain regions 100 and/or the fins 58/60 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 100 may be in situ doped during growth.

As a result of the epitaxy processes used to form the epitaxial source/drain regions 100 in the region 50N and the region 50P, upper surfaces of the epitaxial source/drain regions have facets which expand laterally outward beyond sidewalls of the fins 58/60. In some embodiments, these facets cause adjacent source/drain regions 100 of a same FinFET to merge as illustrated by FIG. 13C. In other embodiments, adjacent source/drain regions 100 remain separated after the epitaxy process is completed as illustrated by FIG. 13D. In the embodiments illustrated in FIGS. 13C and 13D, gate spacers 98 are formed covering a portion of the sidewalls of the fins 58/60 that extend above the STI regions 80 thereby blocking the epitaxial growth. In some other embodiments, the spacer etch used to form the gate spacers 98 may be adjusted to remove the spacer material to allow the epitaxially grown region to extend to the surface of the STI region 80.

Figure 14B:
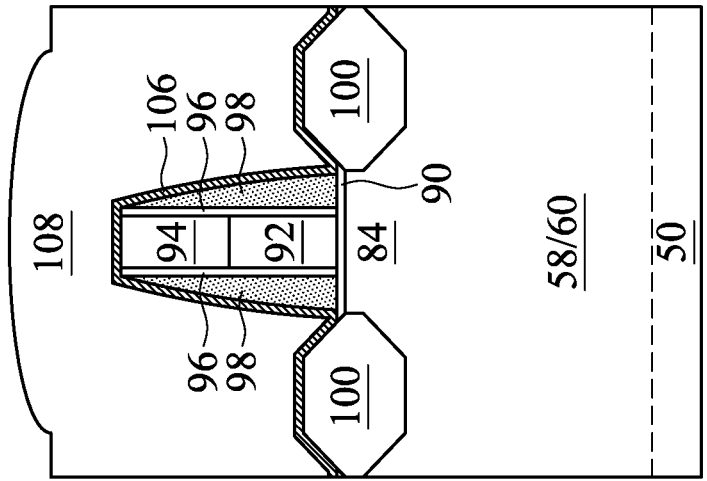
Figure 14A:
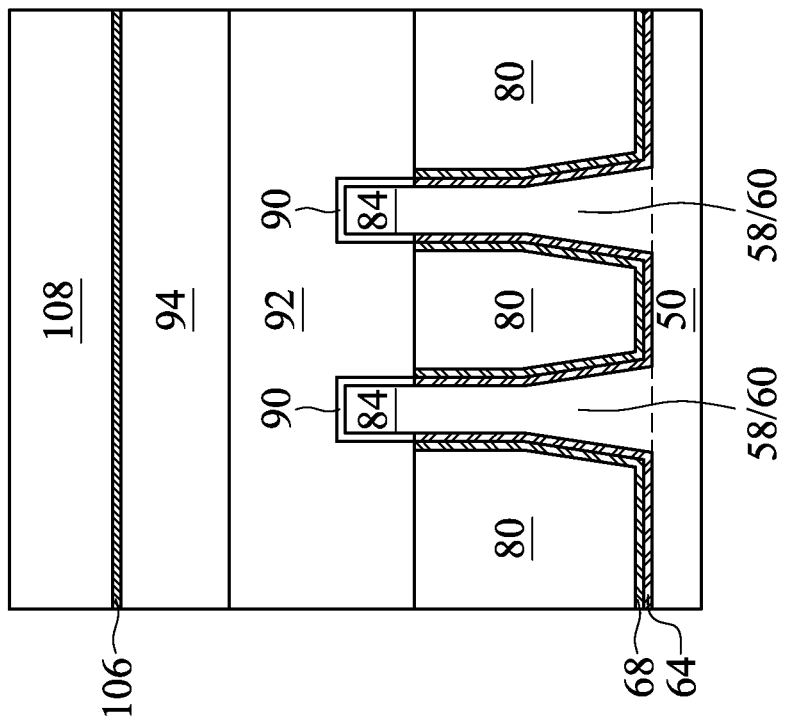

In FIGS. 14A and 14B, a first interlayer dielectric (ILD) 108 is deposited over the structure illustrated in the previous figures. The first ILD 108 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 106 is disposed between the first ILD 108 and the epitaxial source/drain regions 100, the masks 94, and the gate spacers 98. The CESL 106 may comprise a dielectric material, such as, silicon nitride, silicon oxide, silicon oxynitride, or the like, having a different etch rate than the material of the overlying first ILD 108.

Figure 15B:
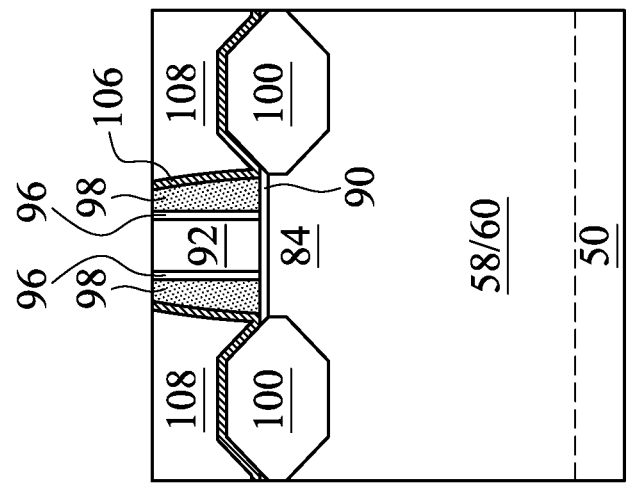
Figure 15A:
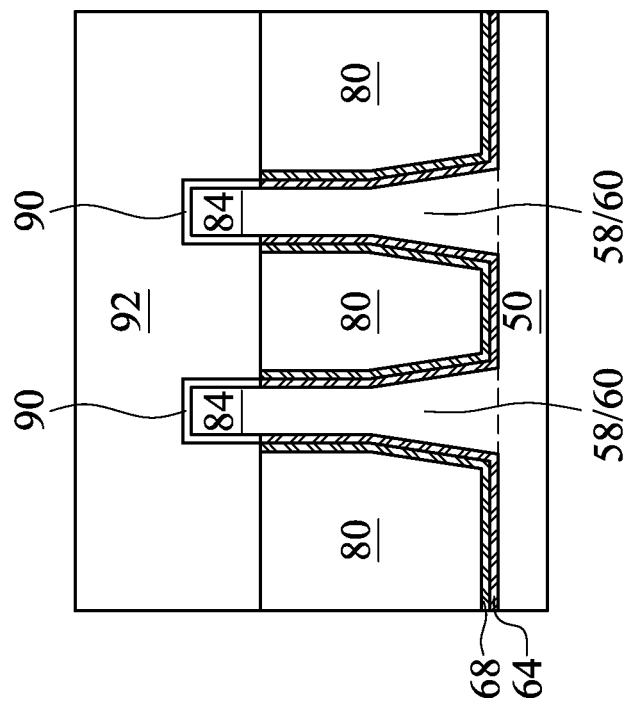

In FIGS. 15A and 15B, a planarization process, such as a CMP, may be performed to level the top surface of the first ILD 108 with the top surfaces of the dummy gates 92 or the masks 94. The planarization process may also remove the masks 94 on the dummy gates 92, and portions of the gate seal spacers 96 and the gate spacers 98 along sidewalls of the masks 94. After the planarization process, top surfaces of the dummy gates 92, the gate seal spacers 96, the gate spacers 98, and the first ILD 108 are level. Accordingly, the top surfaces of the dummy gates 92 are exposed through the first ILD 108. In some embodiments, the masks 94 may remain, in which case the planarization process levels the top surface of the first ILD 108 with the top surfaces of the masks 94.

Figure 16B:
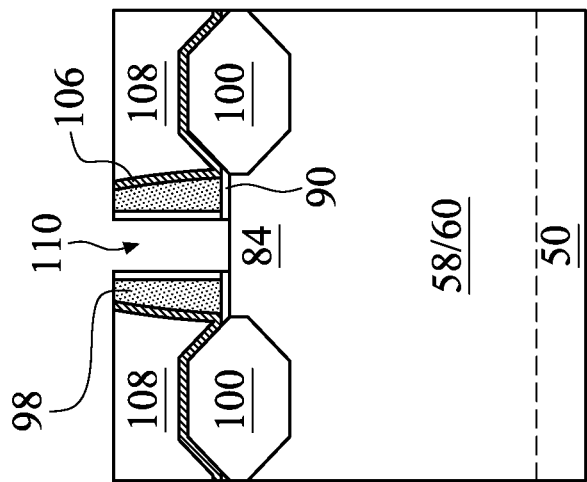
Figure 16A:
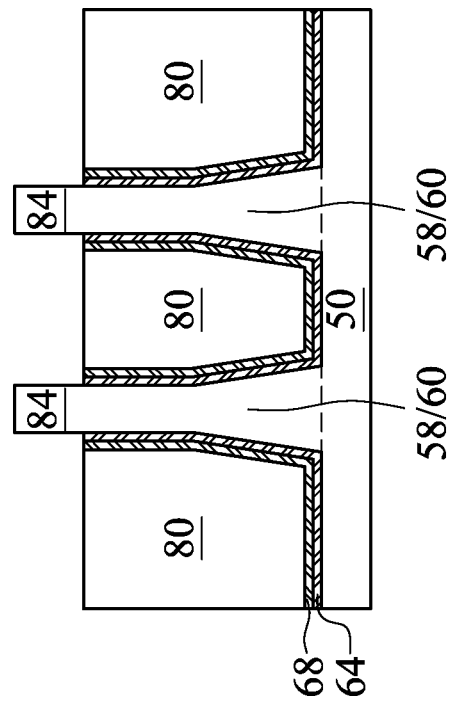

In FIGS. 16A and 16B, the dummy gates 92, and the masks 94 if present, are removed in an etching step(s), so that recesses 110 are formed. Portions of the dummy dielectric layer 90 in the recesses 110 may also be removed. In some embodiments, only the dummy gates 92 are removed and the dummy dielectric layer 90 remains and is exposed by the recesses 110. In some embodiments, the dummy dielectric layer 90 is removed from recesses 110 in a first region of a die (e.g., a core logic region) and remains in recesses 110 in a second region of the die (e.g., an input/output region). In some embodiments, the dummy gates 92 are removed by an anisotropic dry etch process. For example, the etching process may include a dry etch process using reaction gas(es) that selectively etches the dummy gates 92 without etching the first ILD 108 or the gate spacers 98. Each recess 110 exposes and/or overlies a channel region 84 of a respective fin 58/60. Each channel region 84 is disposed between neighboring pairs of the epitaxial source/drain regions 100. During the removal, the dummy dielectric layer 90 may be used as an etch stop layer when the dummy gates 92 are etched. The dummy dielectric layer 90 may then be optionally removed after the removal of the dummy gates 92.

Figure 17B:
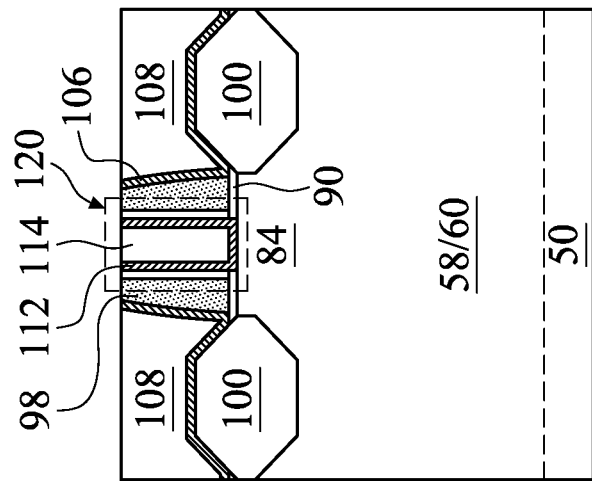
Figure 17A:
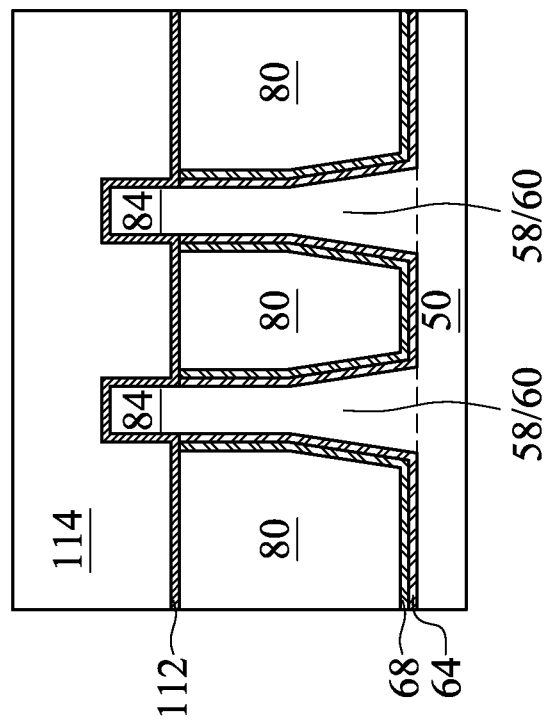
Figure 17C:
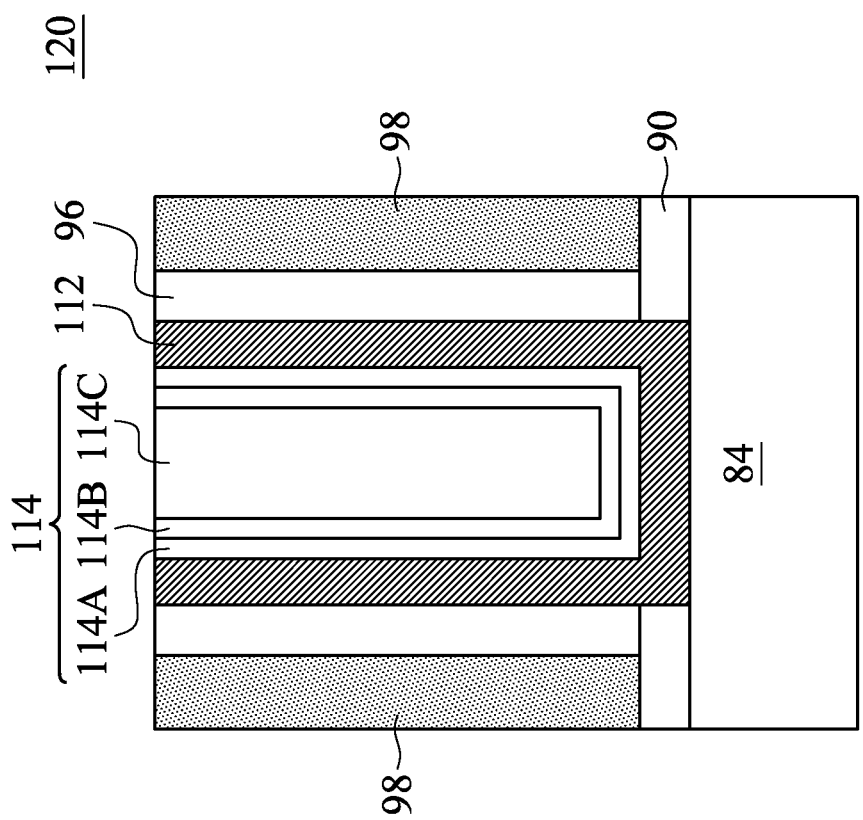

In FIGS. 17A and 17B, gate dielectric layers 112 and gate electrodes 114 are formed for replacement gates. FIG. 17C illustrates a detailed view of region 120 of FIG. 17B. Gate dielectric layers 112 are deposited conformally in the recesses 110, such as on the top surfaces and the sidewalls of the fins 58/60 and on sidewalls of the gate seal spacers 96/gate spacers 98. Although not specifically illustrated, the gate dielectric layers 112 may also be formed on the top surface of the first ILD 108. In accordance with some embodiments, the gate dielectric layers 112 comprise silicon oxide, silicon nitride, or multilayers thereof. In some embodiments, the gate dielectric layers 112 include a high-k dielectric material, and in these embodiments, the gate dielectric layers 112 may have a k value greater than about 7.0, and may include a metal oxide or a silicate of hafnium, aluminum, zirconium, lanthanum, manganese, barium, titanium, lead, and combinations thereof. The formation methods of the gate dielectric layers 112 may include Molecular-Beam Deposition (MBD), ALD, PECVD, and the like. In embodiments where portions of the dummy dielectric layer 90 remains in the recesses 110, the gate dielectric layers 112 include a material of the dummy dielectric layer 90 (e.g., SiO$_2$).

The gate electrodes 114 are deposited over the gate dielectric layers 112, respectively, and fill the remaining portions of the recesses 110. The gate electrodes 114 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 114 is illustrated in FIG. 17B, the gate electrode 114 may comprise any number of liner layers 114A, any number of work function tuning layers 114B, and a fill material 114C as illustrated by FIG. 17C. After the filling of the recesses 110, a planarization process, such as a CMP, may be performed to remove the excess portions of the gate dielectric layers 112 and the material of the gate electrodes 114, which excess portions are over the top surface of the ILD 108. The remaining portions of material of the gate electrodes 114 and the gate dielectric layers 112 thus form replacement gates of the resulting FinFETs. The gate electrodes 114 and the gate dielectric layers 112 may be collectively referred to as a "gate stack." The gate and the gate stacks may extend along sidewalls of a channel region 84 of the fins 58/60.

The formation of the gate dielectric layers 112 in the region 50N and the region 50P may occur simultaneously such that the gate dielectric layers 112 in each region are formed from the same materials, and the formation of the gate electrodes 114 may occur simultaneously such that the gate electrodes 114 in each region are formed from the same materials. In some embodiments, the gate dielectric layers 112 in each region may be formed by distinct processes, such that the gate dielectric layers 112 may be different materials, and/or the gate electrodes 114 in each region may be formed by distinct processes, such that the gate electrodes 114 may be different materials. Various masking steps may be used to mask and expose appropriate regions when using distinct processes.

Figure 18B:
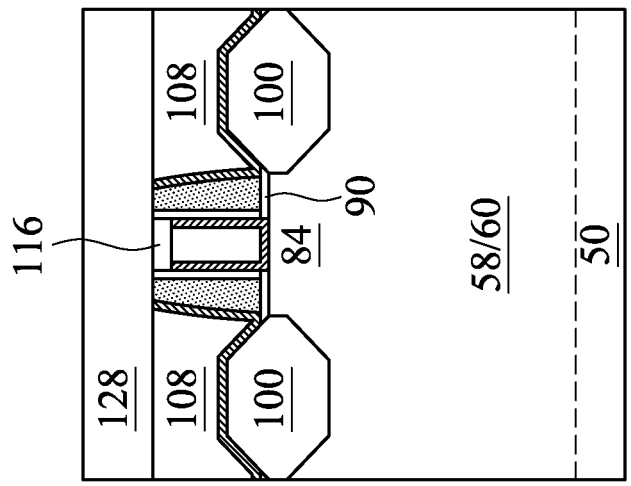
Figure 18A:
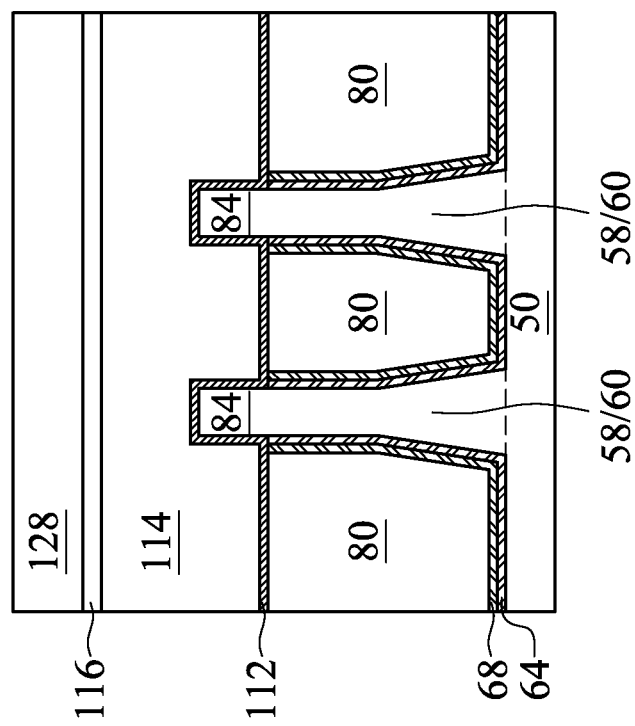

In FIGS. 18A and 18B, a second ILD 128 is deposited over the first ILD 108. In some embodiments, the second ILD 128 is a flowable film formed by a flowable CVD method. In some embodiments, the second ILD 128 is formed of a dielectric material such as PSG, BSG, BPSG, USG, or the like, and may be deposited by any suitable method, such as CVD and PECVD. In accordance with some embodiments, before the formation of the second ILD 128, the gate stack (including the gate dielectric layer 112 and the corresponding overlying gate electrode 114) is recessed, so that a recess is formed directly over the gate stack and between opposing portions of the gate seal spacers 96/gate spacers 98. A gate mask 116 comprising one or more layers of dielectric material, such as silicon nitride, silicon oxynitride, or the like, is filled in the recess, followed by a planarization process to remove excess portions of the dielectric material extending over the first ILD 108. The subsequently formed gate contacts 130 (FIGS. 19A and 19B) penetrate through the gate mask 116 to contact the top surface of the recessed gate electrode 114.

Figure 19B:
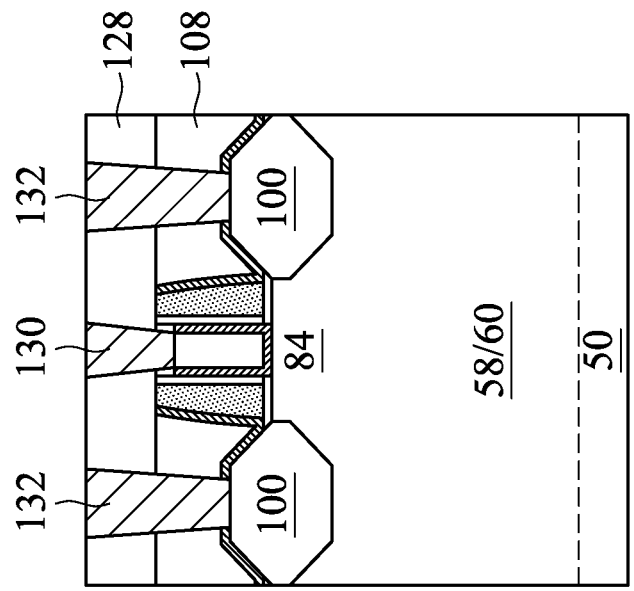
Figure 19A:
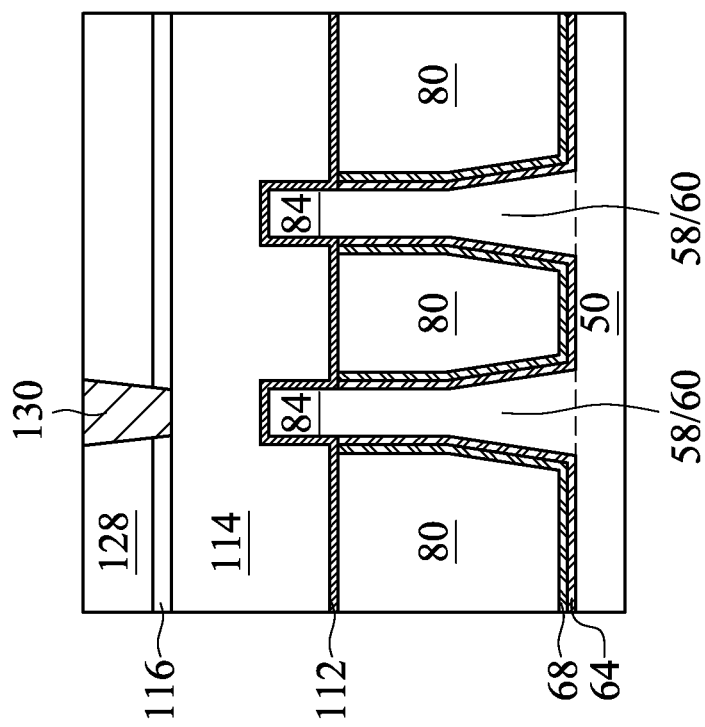

In FIGS. 19A and 19B, gate contacts 130 and source/drain contacts 132 are formed through the second ILD 128 and the first ILD 108 in accordance with some embodiments. Openings for the source/drain contacts 132 are formed through the first and second ILDs 108 and 128, and openings for the gate contact 130 are formed through the second ILD 128 and the gate mask 116. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a top surface of the second ILD 128. The remaining liner and conductive material form the source/drain contacts 132 and gate contacts 130 in the openings. In some embodiments, a silicide may be formed at the interface between the epitaxial source/drain regions 100 and the source/drain contacts 132. The source/drain contacts 132 are physically and electrically coupled to the epitaxial source/drain regions 100, and the gate contacts 130 are physically and electrically coupled to the gate electrodes 114. The source/drain contacts 132 and gate contacts 130 may be formed in different processes, or may be formed in the same process. Although shown as being formed in the same cross-sections, in some embodiments, each of the source/drain contacts 132 and gate contacts 130 may be formed in different cross-sections, which may avoid shorting of the contacts.

Embodiments may achieve advantages. By choosing certain semiconductor and insulating liner layers (e.g., the semiconductor liner layer 64 and the insulation liner layer 68) in the formation of the STI regions 80, the fins 58/60 may be better protected from oxidation during certain anneal steps. In addition, maintaining certain thicknesses of insulating material (e.g., the semiconductor liner layer 64, the insulation liner layer 68, the first insulation material 72, and the second insulation material 76) during each of the anneal steps ensures that the first insulation material 72 sufficiently densifies while further protecting the fins 58/60 from oxidation. For example, the fin profiles may be approximately the same in different sections of the substrate and whether forming 2-cut STI regions (e.g., for a FinFet in a ring oscillator (RO) cell), 8-cut STI regions (e.g., for a FinFET in a phase change memory (PCM) cell), or 12-cut STI regions, wherein formation of the larger STI regions (e.g., 8-cut and/or 12-cut STI regions) in different sections of the substrate would tend to make the fins more susceptible to oxidation. For example, the width of a PCM fin 60 at all elevations in a top portion of the PCM fin 60 may be at least 80% (or even 82%) of the width of an RO fin 60 at corresponding elevations of the RO fin 60—the widths differing by less than about 20%. Indeed, the width of the PCM fin 60 at all elevations in an upper 80% of the top portion of the PCM fin 60 may be at least 95% (or even 97%) of the width of the RO fin 60 at corresponding elevations of the RO fin 60—the widths differing by less than about 5%. In addition, the width of the PCM fin 60 at a lowermost point of the top portion of the PCM fin 60 may also be at least 95% (or even 97%) of the width of the RO fin 60 at a corresponding lowermost point—the widths differing by less than about 5%. Further, a horizontal width of the fins (having a different type of STI region, such as the RO fin 60 and the PCM fin 60) may differ at any location by less than about 18% to about 20%, and in the upper half of the top portion of the fins by less than about 3%. Furthermore, along a top half of the fins 58/60, a horizontal width (parallel to a major surface of the substrate) will vary by less than about 14%, such as less than about 12% or less than about 10%. The fins 58/60 not only maintain the squared profile as designed, the fins 58/60 will comprise little to no oxygen allowing the fins 58/60 to maintain the desired lattice structure—particularly for the second fins 60 comprising SiGe, which maintains a strained lattice structure—for improved performance. Benefits to the performance may include an increase in PMOS mobility by about 10-15%, an increase in the effective gain ($I_{d,eff}$) and on/off gain ($I_{d,of}$) of about 3-10%, and an increase in the ring oscillator speed (e.g., inverter between NMOS and PMOS) of about 2%.

In an embodiment, a method of forming a semiconductor device includes patterning a mask layer and a semiconductor material to form a first fin and a second fin with a trench interposing the first fin and the second fin. A first liner layer is formed over the first fin, the second fin, and the trench. An insulation material is formed over the first liner layer. A first anneal is performed, which is followed by performing a first planarization of the insulation material to form a first planarized insulation material. After which, a top surface of the first planarized insulation material is over a top surface of the mask layer. A second anneal is performed, which is followed by performing a second planarization of the first planarized insulation material to form a second planarized insulation material. The insulation material is etched to form shallow trench isolation (STI) regions, and a gate structure is formed over the semiconductor material.

In another embodiment, a method of forming a semiconductor device includes forming a first fin stack over a first region of a substrate and a second fin stack over a second region of the substrate. The first fin stack comprises a silicon fin, and the second fin stack comprises a silicon germanium fin. A silicon liner layer is formed over the first fin stack and the second fin stack, and an insulation liner layer is formed over the silicon liner layer. An insulation material is formed over the insulation liner layer, such that the insulation material has a first top surface. A first anneal is performed. The insulation material is planarized to form a first planarized insulation material, such that the first planarized insulation material has a second top surface above a first top surface of the first fin stack and above a first top surface of the second fin stack. A second anneal is performed. The first planarized insulation material is planarized, thereby exposing a portion of the second fin stack.

In yet another embodiment, a method of forming a semiconductor device includes forming a first semiconductor fin and a second semiconductor fin over a substrate. A semiconductor layer is deposited over and between the first semiconductor fin and the second semiconductor fin, a first insulating layer is deposited over the semiconductor layer, the first insulating layer comprising an oxide, and a second insulating layer is deposited over the first insulating layer. A first anneal is performed, which oxidizes at least a portion of the semiconductor layer. A first planarization is performed on the second insulating layer, such that the second insulating layer has a first level top surface that is above the first semiconductor fin and the second semiconductor fin. A second anneal is performed, and the semiconductor layer is oxidized after the second anneal. A second planarization is performed on the second insulating layer, such that the second insulating layer has a second level top surface. The second insulating layer is recessed, such that the second insulating layer has a third top surface that is below top surfaces of the first semiconductor fin and the second semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming an insulation material over a first fin;
    performing a first anneal;
    performing a first planarization of the insulation material after performing the first anneal to form a first planarized insulation material, a top surface of the first planarized insulation material being over a top surface of the first fin;
    performing a second anneal, the second anneal being different from the first anneal; and
    performing a second planarization of the first planarized insulation material after performing the second anneal to form a second planarized insulation material, the second planarization being different from the first planarization.

2. The method of claim 1, wherein while performing the first anneal, the insulation material has a first thickness directly above the first fin, and wherein while performing the second anneal, the insulation material has a second thickness directly above the first fin, the second thickness being less than the first thickness.

3. The method of claim 1 further comprising, before forming the insulation material over the first fin, forming a hard mask over the first fin.

4. The method of claim 3, wherein the performing the second planarization comprises removing the hard mask.

5. The method of claim 3 further comprising etching the second planarized insulation material to form a shallow trench isolation region.

6. The method of claim 1, wherein the first anneal comprises a first dry anneal, and wherein the second anneal comprises a second dry anneal.

7. The method of claim 6, wherein the first anneal further comprises a first wet anneal, and wherein the second anneal further comprises a second wet anneal.

8. A method of forming a semiconductor device, the method comprising:
    forming an insulation material over a first fin stack, the insulation material having a first thickness above a top surface of the first fin stack;
    performing a first anneal;
    planarizing the insulation material to form a first planarized insulation material, the first planarized insulation material having a second thickness above the top surface of the first fin stack;
    performing a second anneal; and
    planarizing the first planarized insulation material to form a second planarized insulation material, the second planarized insulation material being level with the first fin stack.

9. The method of claim 8 further comprising forming the first fin stack and a second fin stack over a substrate, wherein a portion of the first fin stack is silicon, and wherein a portion of the second fin stack is silicon germanium.

10. The method of claim 9 further comprising forming a silicon liner layer over at least one of the first fin stack and the second fin stack.

11. The method of claim 10, wherein the performing the first anneal comprises oxidizing the silicon liner layer.

12. The method of claim 11, wherein after performing the first anneal, an outer portion of the second fin stack comprises SiGeO with an oxygen concentration of less than about 5%.

13. The method of claim 8 further comprising etching the second planarized insulation material to form a shallow trench isolation region, a top surface of the shallow trench isolation region being below an uppermost point of the first fin stack.

14. A method of forming a semiconductor device, the method comprising:
depositing a first insulating layer over a first semiconductor fin, a lowermost portion of a first top surface of the first insulating layer being above the first semiconductor fin;
depositing a second insulating layer over the first insulating layer;
performing a first anneal;
performing a first planarization on the first insulating layer and the second insulating layer, wherein after the first planarization the first insulating layer comprises a second top surface, the second top surface being above the first semiconductor fin;
performing a second anneal; and
performing a second planarization on the first insulating layer.

15. The method of claim 14, wherein after the second planarization the first insulating layer comprises a third top surface, and wherein the third top surface of the first insulating layer is above a fourth top surface of the first semiconductor fin.

16. The method of claim 14 further comprising, before the depositing the first insulating layer, forming a semiconductor layer over the first semiconductor fin.

17. The method of claim 16, wherein the performing the first anneal comprises oxidizing an outer portion of the semiconductor layer, wherein the outer portion is most proximal to the first insulating layer, wherein performing the second anneal comprises oxidizing an inner portion of the semiconductor layer, and wherein the inner portion is most proximal to the first semiconductor fin.

18. The method of claim 14, wherein the depositing the first insulating layer comprises depositing the first insulating layer over a second semiconductor fin, and wherein the method further comprises etching the first insulating material to form a first isolation region directly adjacent to the first semiconductor fin and a second isolation region directly adjacent to the second semiconductor fin.

19. The method of claim 18, wherein the second isolation region is larger than the first isolation region.

20. The method of claim 19, wherein after performing the second anneal:
a plurality of widths of an upper 80% of the second semiconductor fin are less than a corresponding plurality of widths of an upper 80% of the first semiconductor fin; and
the plurality of widths of the upper 80% of the second semiconductor fin are at least 95% of the corresponding plurality of widths of the upper 80% of the first semiconductor fin.

* * * * *